(12) United States Patent
Lim et al.

(10) Patent No.: US 11,256,373 B2
(45) Date of Patent: Feb. 22, 2022

(54) INPUT SENSING UNIT AND DISPLAY DEVICE INCLUDING THE SAME

(71) Applicants: SAMSUNG DISPLAY CO., LTD., Yongin-si (KR); UNIST (Ulsan National Institute of Science and Technology), Ulsan (KR)

(72) Inventors: Jae Ik Lim, Yongin-si (KR); Won Sang Park, Yongin-si (KR); Hye Yong Chu, Yongin-si (KR); Kibog Park, Ulsan (KR); Sungchul Jung, Ulsan (KR); Hanbyul Jin, Ulsan (KR)

(73) Assignees: SAMSUNG DISPLAY CO., LTD., Yongin-si (KR); UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 44 days.

(21) Appl. No.: 16/188,497

(22) Filed: Nov. 13, 2018

(65) Prior Publication Data
US 2019/0179448 A1 Jun. 13, 2019

(30) Foreign Application Priority Data
Dec. 13, 2017 (KR) .......... 10-2017-0171592

(51) Int. Cl.
*G06F 3/044* (2006.01)
*G06F 3/041* (2006.01)
*H01L 27/32* (2006.01)

(52) U.S. Cl.
CPC .......... *G06F 3/044* (2013.01); *G06F 3/0416* (2013.01); *G06F 3/0445* (2019.05);
(Continued)

(58) Field of Classification Search
CPC ...... G06F 3/044; G06F 3/0445; G06F 3/0446; G06F 3/0448; G06F 3/0416; G06F 2203/04112
See application file for complete search history.

(56) References Cited

U.S. PATENT DOCUMENTS

2016/0026335 A1* 1/2016 Ahn .................. G06F 3/044
345/173
2016/0258894 A1 9/2016 Futatsugi
(Continued)

FOREIGN PATENT DOCUMENTS

KR 10-2015-0014063 2/2015
KR 10-2016-0108168 9/2016

OTHER PUBLICATIONS

Youngeun Jeon et al., "Highly Flexible Touch Screen Panel Fabricated with Silver Nanowire Crossing Electrodes and Transparent Bridges", Journal of the Optical Society of Korea, vol. 19, No. 5, Oct. 2015, pp. 508-513.

(Continued)

*Primary Examiner* — Dennis P Joseph
(74) *Attorney, Agent, or Firm* — F. Chau & Associates, LLC

(57) ABSTRACT

An input sensing unit that utilizes conductive layers to sense various types of input. The input sensing unit may include a first conductive layer including first sensing electrodes; a second conductive layer disposed on the first conductive layer, the second conductive layer including second sensing electrodes and third sensing electrodes; and at least one insulating layer insulating the first conductive layer and the second conductive layer from each other. The input sensing unit senses at least one of a touch, a pressure, and a degree of moisture based on a change in capacitance between the conductive layers.

20 Claims, 8 Drawing Sheets

(52) U.S. Cl.
CPC .......... *G06F 3/0446* (2019.05); *G06F 3/0448* (2019.05); *G06F 2203/04112* (2013.01); *H01L 27/323* (2013.01)

(56) References Cited

U.S. PATENT DOCUMENTS

2016/0349871 A1* 12/2016 Tanemura ................ G06F 3/044
2016/0362586 A1* 12/2016 Kiyoto ........................ C09J 7/29
2017/0060239 A1*  3/2017 Lim ......................... G06F 3/041
2017/0060299 A1   3/2017 Choi et al.
2017/0172439 A1   6/2017 Zhu et al.
2018/0314386 A1* 11/2018 Tsai ....................... G06F 3/0418

OTHER PUBLICATIONS

Shanshan Yao et al., "Wearable multifunctional sensors using printed stretchable conductors made of silver nanowires", Nanoscale, 2014, pp. 2345-2352.

* cited by examiner

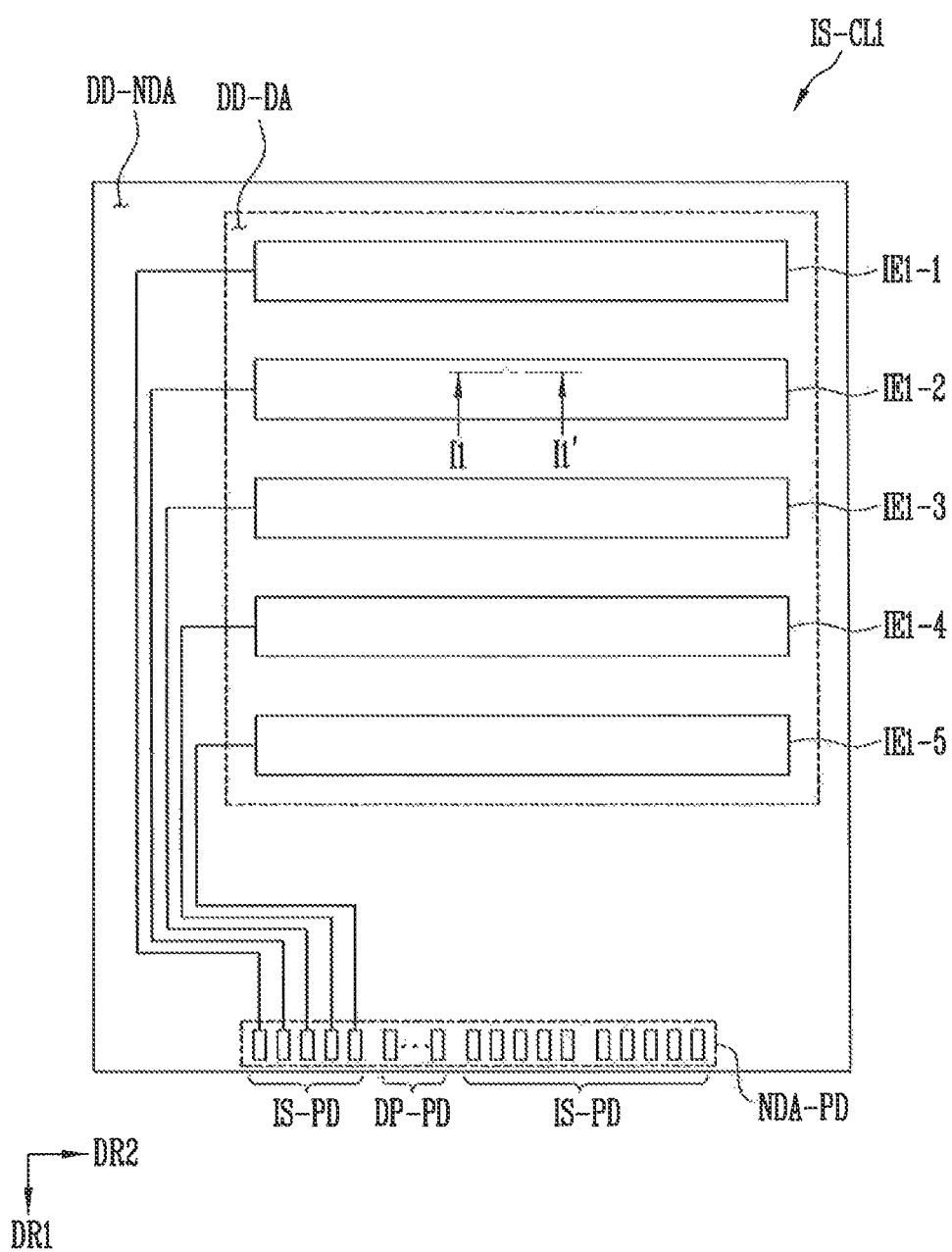

INPUT SENSING UNIT AND DISPLAY DEVICE INCLUDING THE SAME

CROSS-REFERENCE TO RELATED APPLICATION

The present application claims priority under 35 U.S.C. § 119(a) to Korean patent application 10-2017-0171592 filed on Dec. 13, 2017 in the Korean Intellectual Property Office, the entire disclosure of which is incorporated by reference herein.

TECHNICAL FIELD

Embodiments of the inventive concept relate to an input sensing unit that can sense touch, pressure and moisture, and a display device including the same.

DISCUSSION OF THE RELATED ART

With the development of information technologies, a display device, which serves as a connection medium between a user and information sources, continues to be developed to meet increased user demands of various display functions. Accordingly, display devices such as a liquid crystal display device and an organic light emitting display device are increasingly used.

Recently, there have been developed display devices that include touch sensors for sensing touches, fingerprint sensors for use in certain security features and application, pressure sensors to enhance touch controls, etc.

SUMMARY

Embodiments of the inventive concept provide an input sensing unit and a display device including the same, which can sense a touch, a pressure, and a degree of moisture.

According to an embodiment of the inventive concept, there is provided an input sensing unit including: a first conductive layer including a plurality of first sensing electrodes; a second conductive layer disposed on the first conductive layer, the second conductive layer including a plurality of second sensing electrodes and a plurality of third sensing electrodes; and at least one insulating layer insulating the first conductive layer and the second conductive layer from each other, wherein the input sensing unit senses at least one or more of a touch, a pressure, and a degree of moisture applied based on a change in distance between electrodes from at least the plurality of the first sensing electrodes, the plurality of the second sensing electrodes and the plurality of the third sensing electrodes.

The plurality of first sensing electrodes may be arranged in a first direction and may extend in a second direction different from the first direction. The plurality of second sensing electrodes may be arranged in the second direction and extend in the first direction. The plurality of third sensing electrodes may be arranged in the second direction and extend in the first direction.

At least one of the plurality of the first sensing electrodes, the plurality of the second plurality of sensing electrodes, and the plurality of the third sensing electrodes have a mesh shape and include a metal.

The plurality of second sensing electrodes and the plurality of third sensing electrodes may be formed in a comb-teeth pattern.

According to some embodiments of the inventive concept, each of the plurality of second sensing electrodes and the plurality of third sensing electrodes may include sub-sensing electrodes arranged in the first direction, the sub-sensing electrodes extending in the second direction.

The width of the sub-sensing electrodes may be set to be substantially equal to a width of the second sensing electrodes and a width of the third sensing electrodes.

The distance between the sub-sensing electrodes may be set to be about 300 µm or more to about 500 µm or less.

The plurality of the first sensing electrodes, the second sensing electrodes, and the third sensing electrodes may be formed of Ag-nanowire.

The at least one insulating layer may include polymethylsiloxane.

According to some embodiments of the inventive concept, pressure may be sensed based on a change in capacitance between at least some of the first sensing electrodes and the second sensing electrodes, and a change in capacitance between at least some of the first sensing electrodes and the third sensing electrodes.

According to an embodiment of the inventive concept, a degree of moisture may be sensed based on a change in capacitance between at least some of the second sensing electrodes and the third sensing electrodes.

According to an embodiment of the inventive concept, there is provided a display device including: a display panel including a display area and a non-display area; and an input sensing unit disposed on the display panel, wherein the input sensing unit includes: a first conductive layer including a plurality of first sensing electrodes; a second conductive layer disposed on the first conductive layer, the second conductive layer including a plurality of second sensing electrodes and a plurality of third sensing electrodes; and at least one insulating layer insulating the first conductive layer and the second conductive layer from each other, wherein the input sensing unit senses at least one of a touch, a pressure, and a degree of moisture based on a change in capacitance between electrodes from at least the plurality of the first sensing electrodes, the plurality of the second sensing electrodes and the plurality of the third sensing electrodes.

The input sensing unit comprises an input sensing layer directly disposed on the display panel that acquires coordinate information or pressure information of an external input.

The plurality of first sensing electrodes may be arranged in a first direction and extend in a second direction different from the first direction. The plurality of second sensing electrodes may be arranged in the second direction and extend in the first direction. In addition, the plurality of third sensing electrodes may be arranged in the second direction and extend in the first direction.

The plurality of second sensing electrodes and the plurality of third sensing electrodes may be formed in a "comb-teeth" pattern.

Each of the plurality of the second sensing electrodes and the plurality of the third sensing electrodes may include sub-sensing electrodes arranged in the first direction, the sub-sensing electrodes extending in the second direction.

The width of the sub-sensing electrodes may be set to be substantially equal to a width of the second sensing electrodes and the third sensing electrodes.

The distance between the sub-sensing electrodes may be set to about 300 µm or more, to about 500 µm or less.

The input sensing unit may be directly disposed on the display panel.

The input sensing unit may further include a base layer disposed under the first conductive layer.

A distance between the sub-sensing electrodes is set to be within a preset value of at least 100 μm.

A timing control circuit is configured to control operation of the display panel, and an input sensing circuit is configured to control the input sensing unit.

The input sensing unit may be driven at about 175-225 KHz under control of the input sensing circuit.

BRIEF DESCRIPTION OF THE DRAWINGS

Example embodiments of the inventive concept will now be described more fully hereinafter with reference to the accompanying drawings; however, the inventive concept may be embodied in different forms and should not be construed as being limited to the embodiments set forth herein. Rather, these embodiments are provided so that this disclosure will be thorough and complete, and will convey the scope of the example embodiments to those skilled in the art.

In the drawing figures, dimensions may be exaggerated to facilitate an explanation of certain features. It will be understood that when an element is referred to as being "between" two elements, it may be the only element between the two elements, or one or more intervening elements may also be present. Like reference numerals refer to like elements throughout.

FIGS. 2A, 2B and 2C are views illustrating sections of a display device according to an embodiment of the inventive concept, in which:

FIG. 2A shows the display device DD may include a display panel DP, an input sensing layer ISL, and a window panel WP, FIG. 2B shows the display device DD may include a display panel DP, an input sensing panel ISP, and a window panel WP, and FIG. 2C shows the display device DD may include a display panel DP, an input sensing layer ISL, and a window layer WL;

FIGS. 7A and 7B are views schematically illustrating an input sensing unit according to an embodiment of the inventive concept, in which FIG. 7A is a plan view of a first conductive layer IS-CL1 of an input sensing unit ISU, and 7B is a plan view of a second conductive layer IS-CL2 of the input sensing unit ISU;

DETAILED DESCRIPTION

Figure 1:
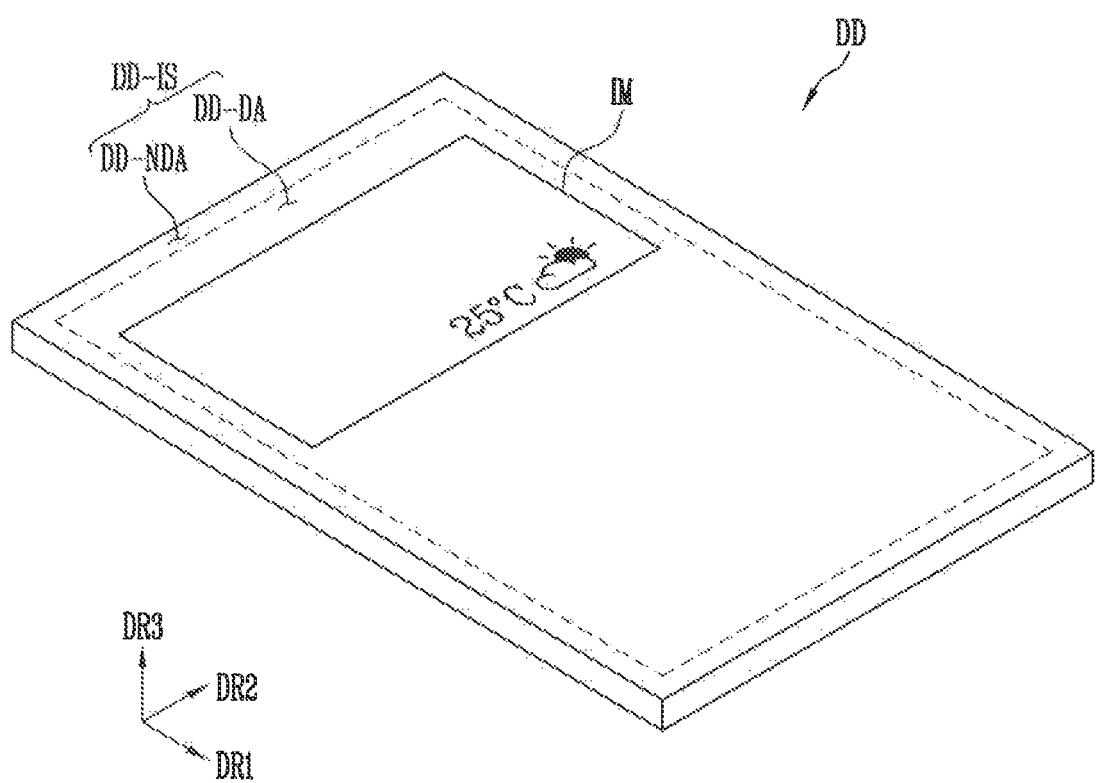
FIG. 1 is a view illustrating a display device according to an embodiment of the inventive concept.

In the following detailed description, only certain embodiments of the inventive concept have been shown and described, simply by way of illustration. As those skilled in the art would realize, the described embodiments may be modified in various ways, all without departing from the spirit or scope of the present disclosure. Accordingly, the drawings and description are to be regarded as illustrative in nature and are not restrictive.

Similar reference numerals refer to similar elements throughout, and duplicative descriptions thereof may not be provided. The thicknesses, ratios, and dimensions of dements may be exaggerated in the drawings to facilitate explanations of certain features discussed herein. As used herein, the term "and/or" includes any and all combinations of one or more of the associated listed items.

It will be understood that, although the terms "first," "second," etc., may be used herein to describe one or more elements, these terms should not be construed as limiting such elements in an ordinal sense. These terms are only used to distinguish one element from another element. Thus, a first dement could be alternately termed a second dement without departing from the spirit and scope of the embodiments of the inventive concept. Similarly, a second element could be alternately termed a first element. Singular forms of terms are intended to include the plural forms as well, unless the context clearly indicates otherwise.

Moreover, a person of ordinary skill in the art should understand and appreciate that spatially relative terms, such as "beneath," "below," "lower," "above," "upper," and the like may be used herein for ease of description to describe one element's spatial relationship to another element(s) as illustrated in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, for example, the terms "below" and "under" can encompass both an orientation of above and below. The device may be otherwise oriented (e.g., rotated 90 degrees or at other orientations) and the spatially relative descriptors used herein should be interpreted accordingly.

It will be further understood that the terms "includes" and "including," when used herein, specify the presence of stated features, integers, acts, operations, elements, and/or components, but do not preclude the presence or addition of one or more other features, integers, steps, operations, elements, components, and/or groups thereof.

Throughout the specification, when an element is referred to as being "connected" or "coupled" to another element, the element can be directly connected or coupled to the another element, or the element can be indirectly connected or coupled to the another element with one or more intervening elements interposed there between. Also, like reference numerals refer to like elements throughout.

FIG. 1 is a view illustrating a display device according to an embodiment of the inventive concept.

As shown in FIG. 1, the display device DD may include a display surface DD-IS.

The display surface DD-IS may be located at a front surface of the display device DD. The display device DD may display an image IM through the display surface DD-IS. The display surface DD-IS is parallel to a surface defined by a first direction DR1 and a second direction DR2. A normal direction of the display surface DD-IS, e.g., a thickness direction of the display device DD with respect to the display surface DD-IS indicates a third direction DR3.

A front surface (or top surface) and a back surface (or bottom surface) of each member or unit described herein below is distinguished by the third direction DR3. However, the first to third directions DR1, DR2, and DR3 illustrated in this embodiment are merely illustrative, and the directions indicated by the first to third directions DR1, DR2, and DR3 are relative concepts for illustrative purposes, and may be changed into other directions. Hereinafter, the first to third directions are directions respectively indicated by the first to third directions DR1, DR2, and DR3, and are designated by like reference numerals.

In an embodiment of the inventive concept, the display device DD including a planar display surface DD-IS is illustrated, but the embodiments of the inventive concept are not limited thereto. For example, the display device DD may include a curved display surface DD-IS or a stereoscopic display surface DD-IS. The display device DD may also have a flexible display surface DD-IS.

The stereoscopic display surface DD-IS may include a plurality of display areas that indicate different directions. For example, the stereoscopic display surface DD-IS may include a polygonal pillar-shaped display surface.

The display device DD according to an embodiment of the inventive concept may be a rigid display device. However, the embodiments of the inventive concept are not limited thereto, and the display device DD may be a flexible display device, a foldable display device, a rollable display device, etc.

In this embodiment of the inventive concept, the display device DD illustrated is applicable to a mobile phone terminal, but there are many other applications. For example, although not shown in the drawing, additional components such as electronic modules, a camera module, a power module, and the like, which are mounted on a main board, are disposed together with the display device DD in a bracket/case, etc., thereby constituting a mobile phone terminal. The display device DD according embodiments of the inventive concept may be applied to devices of various sizes, for example, to large-sized electronic devices such as televisions and monitors and to medium-/small-sized electronic devices such as tablet PCs, vehicle navigation systems, game consoles, and smart watches, just to name a few non-limiting possibilities.

As shown in FIG. 1, the display surface DD-IS includes a display area DD-DA in which the image IM is displayed and a non-display area DD-NDA adjacent to the display area DD-DA. In some embodiments of the inventive concept, the non-display area may constitute the bezel area of the display. The non-display area DD-NDA is an area in which images are not displayed. In FIG. 1, temperature and weather images are illustrated as an example of the image IM, but a person of ordinary skill in the art should understand and appreciate the types of images or graphics displayed are virtually unlimited.

As shown in FIG. 1, the display area DD-DA may have a quadrangular shape. The non-display area DD-NDA may surround the display area DD-DA, and for example, may form a partial perimeter or a full perimeter around the display area DD-DA. However, embodiments of the inventive concept are not limited thereto, and the shapes of the display area DD-DA and the non-display area DD-NDA may be differently designed than discussed herein above.

Figure 2A:
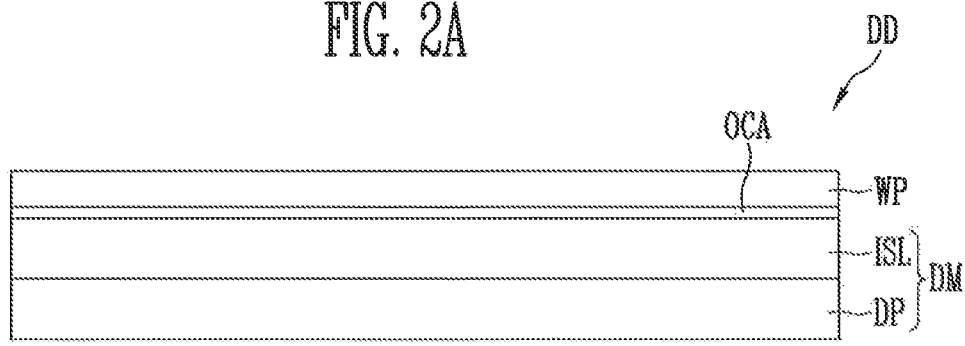
Figure 2A:
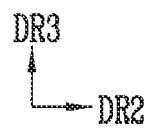
Figure 2B:
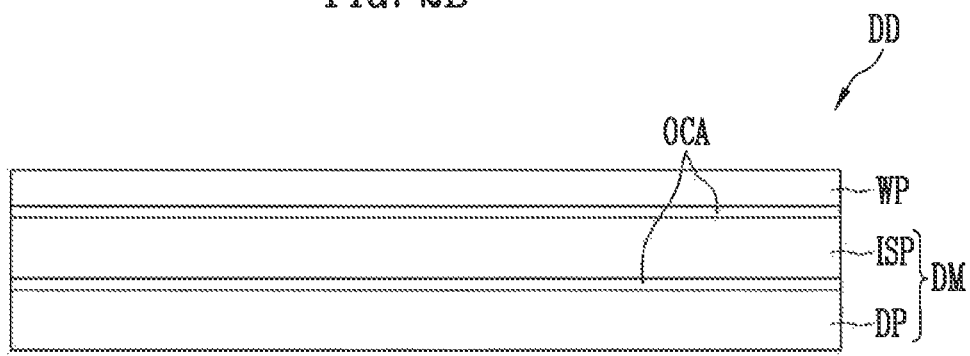
Figure 2B:
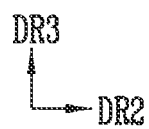
Figure 2C:
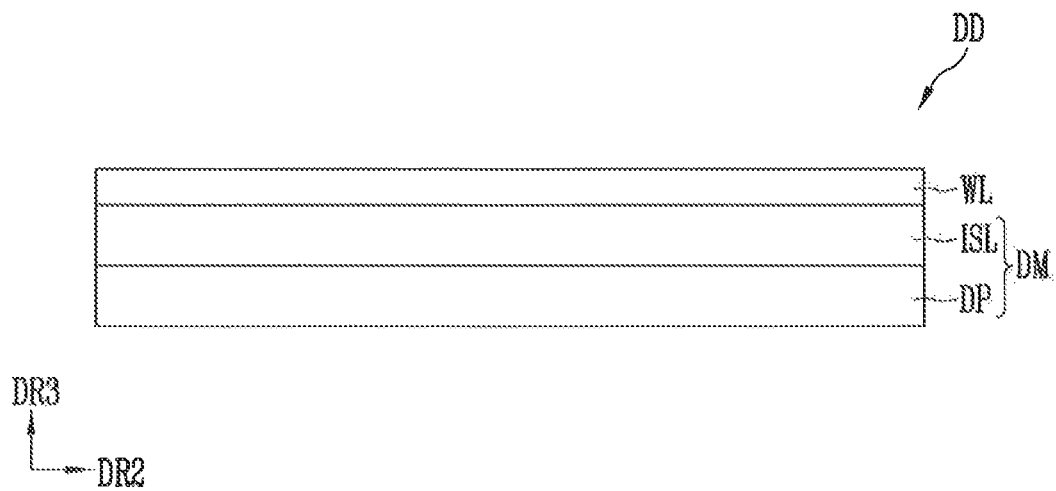

FIGS. 2A, 2B and 2C are sectional views of a display device DD according to an embodiment of the inventive concept. For example, FIGS. 2A, 2B, and 2C may illustrate sections of an embodiment of the display device such as shown in FIG. 1.

FIGS. 2A, 2B and 2C illustrate sections defined by a second direction DR2 and a third direction DR3. FIGS. 2A, 2B and 2C are simply illustrated to describe a stacking relationship between a functional panel and/or functional units, which constitute the display device DD.

The display device DD, according to an embodiment of the inventive concept, may include a display panel DP, an input sensing unit, a reflection preventing unit, and a window unit. At least some components from among the display panel DP, the input sensing unit, the reflection preventing unit, and the window unit, may be formed by a consecutive process. Alternatively, at least some components among the display panel DP, the input sensing unit, the reflection preventing unit, and the window unit may be coupled to each other through an adhesive member. In FIGS. 2A, 2B, and 2C, an optically transparent adhesive member, (e.g., an optically-clear adhesive (OCA)) may be illustrated as an example of the adhesive member. The adhesive member described herein below may include, for example, a general adhesive or a gluing agent. In an embodiment of the inventive concept, the reflection preventing unit and the window unit may be replaced with other components or may be omitted. For example, in some embodiments of the inventive concept, the reflection preventing unit may be omitted.

In FIGS. 2A, 2B and 2C, a description of the reflection preventing unit is omitted.

Between the input sensing unit and the window unit, a corresponding component formed with another component through a consecutive process may be expressed as a "layer."

Between the input sensing unit and the window unit, a corresponding component coupled to another component through an adhesive member may be expressed as a "panel."

The "panel" includes a base layer that provides a base surface, e.g., a synthetic resin film, a composite material film, a glass substrate, and the like, but the base layer may be omitted in the "layer" that has been discussed herein above. In other words, the unit expressed as the "layer" may be disposed on a base surface provided by another unit.

The input sensing unit and the window unit may be designated as an input sensing panel ISP and a window panel WP, or may be designated as an input sensing layer ISL and a window layer WL according to whether there is an existence or a non-existence of a base layer.

As shown in FIG. 2A, the display device DD may include a display panel DP, an input sensing layer ISL, and a window panel WP.

The display panel DP may generate an image.

The input sensing layer ISL may be directly disposed on the display panel DP.

In this specification, a phrase such as "component B is directly disposed on component A" is to be understood as meaning that no separate adhesive layer/adhesive member is disposed between the component A and the component B. The component B is formed on a base surface provided by the component A through a consecutive process after the component A is formed.

The display panel DP and the input sensing layer ISL, which may be directly disposed on the display panel DP, may be defined as a display module DM.

An operatically transparent adhesive member OCA may be disposed between the display module DM and the window panel WP.

In an embodiment of the inventive concept, the display panel DP may be a light emitting display panel, but the display panel DP is not particularly limited thereto. For example, the display panel DP may be an organic light emitting display panel or a quantum dot light emitting display panel. An emitting layer of the organic light emitting display panel may include an organic light emitting material. An emitting layer of the quantum dot light emitting display panel may include a quantum dot, a quantum rod, and the like. Hereinafter, the display panel DP is described as the organic light emitting display panel.

The input sensing layer ISL may acquire coordinate information or pressure information of an external input (e.g., a touch event). In an embodiment of the inventive concept, although not separately shown in the drawings, the display module DM may further include a protective member PM disposed on a bottom surface of the display panel DP.

The protective member PM and the display panel DP may be coupled to each other through an adhesive member. Each of the display devices DD of FIGS. 2B and 2C, which are described herein below, may further include a protective member PM.

In an embodiment of the inventive concept, the window panel WP may include a base film and a light shielding pattern.

The base film may include a glass substrate and/or a synthetic resin film. The base film is not limited to a single layer. The base film may include two or more layers coupled to each other through an adhesive member.

The light shielding pattern may partially overlap with the base film. The light shielding pattern may be disposed on a back surface of the base film to define a bezel area of the display device DD, e.g., the non-display area DD-NDA (see FIG. 1). The light shielding pattern is a colored organic layer, and may be formed through coating.

Although not separately shown in the drawings, the window panel WP may further include a functional coating layer disposed on a front surface of the base film. The functional coating layer may include a fingerprint preventing layer, a reflection preventing layer, a hard coating layer, and the like.

As shown in FIG. 2B, the display device DD may include a display panel DP, an input sensing panel ISP, and a window panel WP.

As shown in FIG. 2C, the display device DD may include a display panel DP, an input sensing layer ISL, and a window layer WL. Adhesive members may be omitted from the construction of the display device DD, and the input sensing layer ISL and the window layer WL may be formed on a base surface provided in the display panel DP through a consecutive process.

In FIGS. 2A, 2B and 2C, it is illustrated that the input sensing unit entirely overlaps with the display panel. As shown in FIG. 2A, the input sensing unit may entirely overlap with the display area DD-DA.

However, in an embodiment of the inventive concept, the input sensing unit may overlap with only a portion of the display area DD-DA or overlap with only the non-display area DD-NDA.

The input sensing unit may be a touch sensing panel for sensing a touch of a user, or a fingerprint sensing panel for sensing fingerprint information of a finger of the user. The touch sensing panel may also sense contact made by a stylus or an electronic pen. In addition, the touch sensing panel may sense "near-touch", sometimes referred to as contact-less touch, based on a change in capacitance that may be sensed when, for example, a finger comes within a certain predefine distance (in a non-limiting example, a few mm) of the touch sensing panel.

Also, the input sensing unit may sense a pressure caused by a touch of a user or sense a degree of moisture of the skin of the user.

The pitch between the sensing electrodes described herein below and the widths of the sensing electrodes may be changed depending on the usage of an input sensing unit. Sensing electrodes of a touch sensing panel may have, for example a width that ranges from a few mm's to a few tenths of a mm, and sensing electrodes of a fingerprint sensing panel may have a width of a few tenths μm to a few hundredths μm. A person of ordinary skill in the art should understand and appreciate that the embodiments of the inventive concept are not limited to the aforementioned examples of widths.

Figure 3:
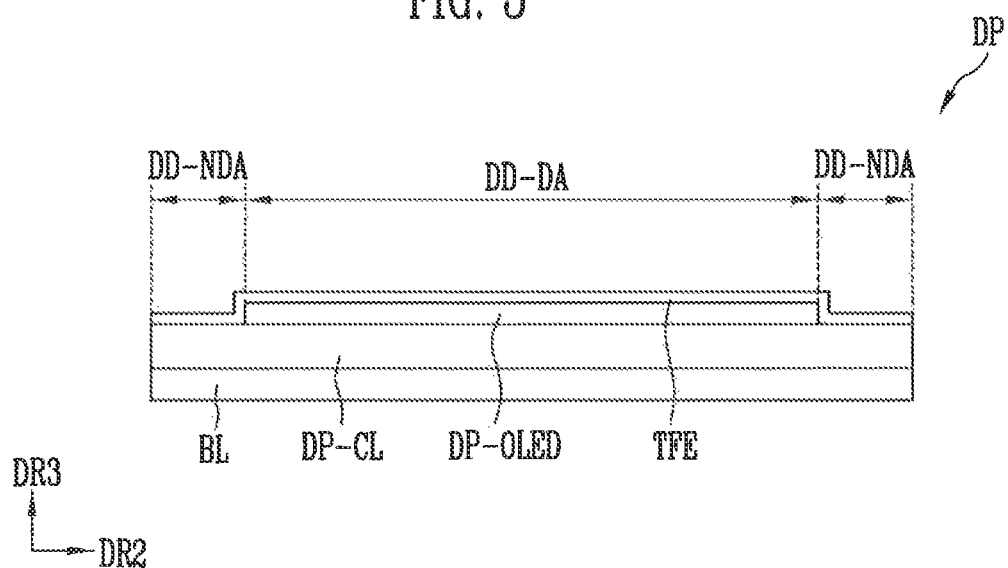
FIG. 3 is a view illustrating a section of a display panel according to an embodiment of the inventive concept.

FIG. 3 is a view illustrating a section of a display panel DP according to an embodiment of the inventive concept. The display panel described herein below may be applied to all of the display devices DD described with reference to FIGS. 2A to 2C.

As shown in FIG. 3, the display panel DP may include a base layer BL, a circuit element layer DP-CL disposed on the base layer BL, a display element layer DP-OLED, and a thin-film encapsulation layer TFE. Although not separately shown in the drawings, the display panel DP may further include functional layers such as a reflection preventing layer and a refractive index adjusting layer.

The base layer BL may include a synthetic resin film. A synthetic resin layer may be formed on a working substrate used in manufacturing of the display panel DP. Subsequently, a conductive layer, an insulating layer, and the like are formed on the synthetic resin layer. If the working substrate is removed, the synthetic resin layer corresponds to the base layer BL. The synthetic resin layer may be a polyimide-based resin layer, and the material of the synthetic resin layer is not limited to any particular type. In addition, the base layer BL may include a glass substrate, a metal substrate, an organic/inorganic composite material substrate, etc.

With continued reference to FIG. 3, the circuit element layer DP-CL may include at least one insulating layer and a circuit element. Hereinafter, the insulating layer included in the circuit element layer DP-CL is referred to as an intermediate insulating layer. The intermediate insulating layer in the circuit element layer DP-CL may include, for example, at least one intermediate inorganic layer and at least one intermediate organic layer.

The circuit element may include, for example a plurality of signal lines, a driving circuit of a pixel, and the like. The circuit element layer DP-CL may be formed through a process of forming an insulating layer, a semiconductor layer, and a conductive layer through coating, deposition, etc. and a process of patterning the insulating layer, the semiconductor layer, and the conductive layer through a photolithography process.

The display element layer DP-OLED may include light emitting devices. The display element layer DP-OLED may include organic light emitting diodes. The display element layer DP-OLED may further include an organic layer such as a pixel defining layer.

The thin film encapsulation layer TFE may encapsulate the display element layer DP-OLED. The thin film encapsulation layer TFE may include at least one insulating layer. In an embodiment of the inventive concept, the thin film encapsulation layer TFE may include at least one inorganic layer (hereinafter, referred to as an encapsulation inorganic layer). In an embodiment of the inventive concept, the thin film encapsulation layer TFE may include at least one organic layer (hereinafter, referred to as an encapsulation organic layer) and at least one encapsulation inorganic layer.

The encapsulation inorganic layer protects the display element layer DP-OLED from moisture/oxygen, and the encapsulation organic layer protects the display element layer DP-OLED from foreign matters such as dust particles.

The encapsulation inorganic layer may include, for example, a silicon nitride layer, a silicon oxynitride layer, a silicon oxide layer, a titanium oxide layer, an aluminum oxide layer, etc., but the encapsulation inorganic layer is not limited to these examples. The encapsulation organic layer may include an acryl-based organic layer, but is not particularly limited.

Figure 4:
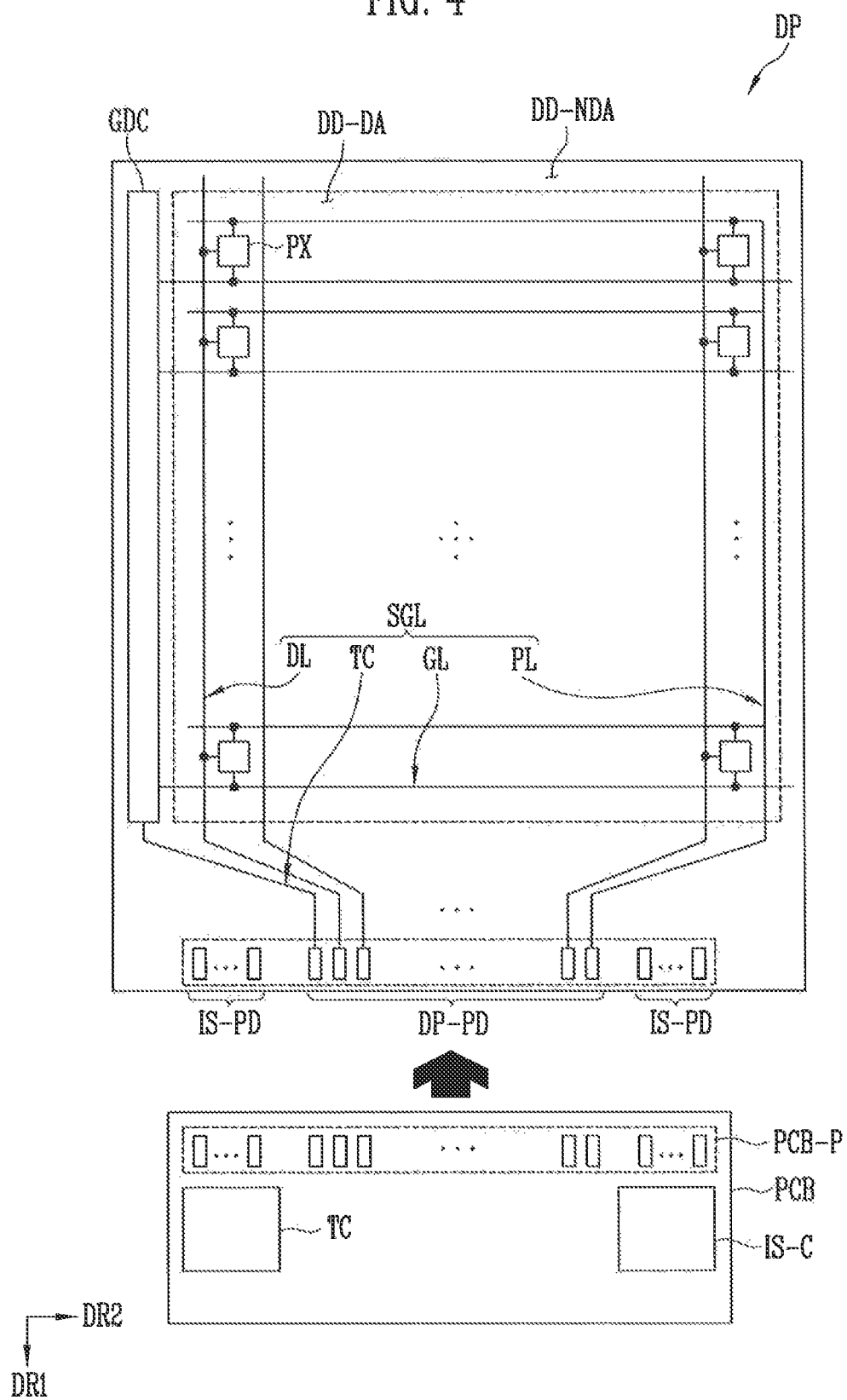
FIG. 4 is a view illustrating a display panel according to an embodiment of the inventive concept.

FIG. 4 illustrates a display panel DP according to an embodiment of the inventive concept.

As shown in FIG. 4, the display panel DP may include a display area DD-DA and a non-display area DD-NDA on a plane. In this embodiment of the inventive concept, the non-display area DD-NDA may be defined along an edge of the display area DD-DA. The overall area of the non-display area is much less than the overall area of the display area DD-DA.

The display area DD-DA and the non-display area DD-DA of the display panel DP may respectively correspond to the display area DD-DA and the non-display area DD-DA of the display device DD shown in FIG. 1. However, the embodiments of the inventive concept are not limited to the arrangement shown in FIG. 1.

As shown in FIG. 4, the display panel DP may include a driving circuit GDC, a plurality of signal lines SGL (hereinafter, referred to as signal lines), a plurality of signal pads DP-PD (hereinafter, referred to as signal pads), and a plurality of pixels PX (hereinafter, referred to as pixels).

The pixels PX may be arranged in the display area DD-DA of the display panel. Each of the pixels PX may include an organic light emitting diode and a pixel driving circuit connected thereto. The driving circuit GDC, the signal lines SGL, the signal pads DP-PD, and the pixel driving circuit may be included in the circuit element layer DP-CL shown in FIG. 3.

The driving circuit GDC may include a scan driving circuit. The scan driving circuit generates a plurality of scan signals (hereinafter, referred to as scan signals), and sequentially outputs the scan signals to a plurality of scan lines GL (hereinafter, referred to as scan lines) which will be described later. The scan driving circuit may additionally output a control signal to a driving circuit of the pixels PX.

The scan driving circuit may include a plurality of thin film transistors formed through the same process as the driving circuit of the pixels PX, e.g., a low-temperature polycrystalline silicon (LTPS) process or a low-temperature polycrystalline oxide (LTPO) process.

The signal lines SGL may include scan lines GL, data lines DL, a power line PL, and a control signal line CSL.

Each of the scan lines GL is connected to a corresponding pixel PX among the pixels PX, and each of the data lines DL is connected to a corresponding pixel PX among the pixels PX. The power line PL is connected to the pixels PX. The control signal line CSL may provide control signals to the scan driving circuit.

The signal lines SGL may overlap with the display area DP-DA and the non-display area DP-NDA.

The signal lines SGL may include a pad part and a line part.

The line part may overlap with the display area DP-DA and the non-display area DP-NDA.

The pad part is connected to an end of the line part. The pad part may be disposed in the non-display area DP-NDA, and overlap with a corresponding signal pad among the signal pads DP-PD, as to be described subsequently in more detail. The area in which the signal pads DP-PD are disposed in the non-display area DP-NDA may be defined as a pad area NDA-PD.

Substantially, the line part connected to the pixels PX may occupy a majority of the signal lines SGL.

The line part is connected to transistors T1 and T2 (see FIG. 5) of the pixel PX. The line part may have a single-/multi-layered structure. The line part may be, for example, an integrated single body or include two or more portions. The two or more portions may be disposed on different layers, and may be connected to each other through a contact hole passing through an insulating layer disposed between the two or more portions.

The display panel DP may further include sensing pads IS-PD disposed in the pad area NDA-DP.

Since the sensing pads IS-PD are formed through the same process of the signal lines SGL, the sensing pads IS-PD may be disposed on the same layer as the signal lines SGL. The sensing pads IS-PD may be selectively provided in the display device DD including the input sensing layer ISL as shown in FIGS. 2A and 2C. The sensing pads IS-PD may also be omitted in the display device including the input sensing panel ISP, as shown in FIG. 2B.

The sensing pads IS-PD may overlap with a pad part of signal lines provided in the input sensing layer ISL shown in FIGS. 2A and 2C. The sensing pads IS-PD may be floating electrodes. The sensing pads IS-PD may be electrically insulated from the signal lines SGL of the display panel DP.

In FIG. 4, a circuit board PCB electrically connected to the display panel DP is additionally illustrated. The circuit board PCB may be a rigid circuit board or a flexible circuit board. The circuit board PCB may be, for example, directly coupled to the display panel DP, or be connected to the display panel DP through another circuit board via an interface.

A timing control circuit TC for controlling an operation of the display panel DP may be disposed on the circuit board PCB.

In addition, an input sensing circuit IS-C for controlling the input sensing unit ISU or the input sensing layer ISL may be disposed on the circuit board PCB. Each of the timing control circuit TC and the input sensing circuit ISC may be mounted in the form of an integrated chip (IC) on the circuit board PCB. In an embodiment of the inventive concept, the timing control circuit TC and the input sensing circuit IS-C may be mounted in the form of one IC on the circuit board PCB.

The circuit board PCB may include circuit board pads PCB-P electrically connected to the display panel DR Although not shown in the drawing, the circuit board PCB may further include signal lines for connecting the circuit board pads PCB-P to the timing control circuit TC and/or the input sensing circuit IS-C.

Figure 5:
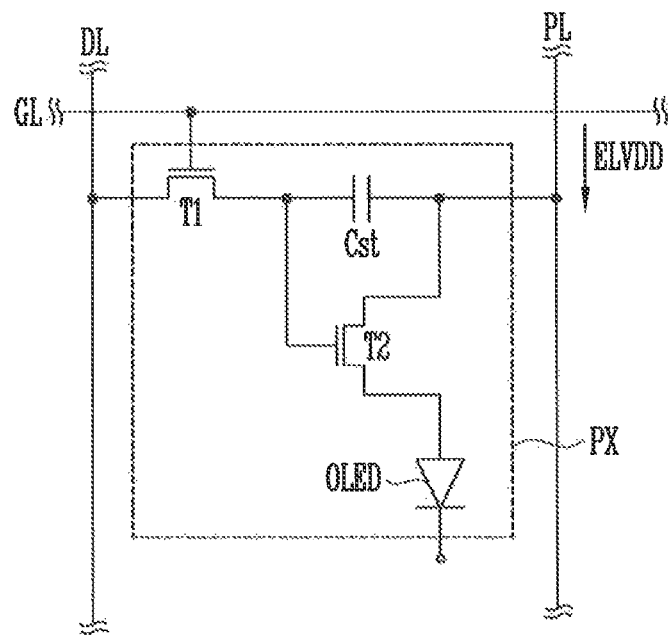
FIG. 5 is a view illustrating a display pixel according to an embodiment of the inventive concept.

FIG. 5 is a view illustrating a display pixel according to an embodiment of the inventive concept. FIG. 5 is an equivalent circuit diagram of a display pixel PX according to an embodiment of the of the inventive concept.

Any one scan line GL, any one data line DL, a power line PL, and a display pixel PX connected thereto are illustrated in FIG. 5. The configuration of the display pixel PX is not limited to FIG. 5 and may be modified and implemented in a manner other than shown and described.

An organic light emitting diode OLED may be a top-emission type light emitting diode or a bottom-emission type light emitting diode. The display pixel PX may include a first transistor (or switching transistor) T1, a second transistor (or driving transistor) T2, and a capacitor Cst, which constitute a pixel driving circuit for driving the organic light emitting diode OLED. A first power voltage ELVDD is provided to the second transistor T2, and a second power voltage ELVSS is provided to the organic light emitting diode OLED. The second power voltage ELVSS may be a voltage lower than the first power voltage ELVDD.

The first transistor T1 outputs a data signal applied to the data line DL in response to a scan signal applied to the scan line GL. The capacitor Cst charges a voltage corresponding to the data signal received from the first transistor T1. The second transistor T2 is connected to the organic light emitting diode OLED. The second transistor T2 controls a driving current flowing through the organic light emitting diode OLED, corresponding to the quantity of charges stored in the capacitor Cst.

The equivalent circuit of FIG. 5 is an embodiment provided for explanatory purposes, and the embodiments of the inventive concept are not limited thereto. The display pixel PX may further include a plurality of transistors and a plurality of capacitors. The organic light emitting diode OLED may be connected between the power line PL and the second transistor T2.

Figure 6:
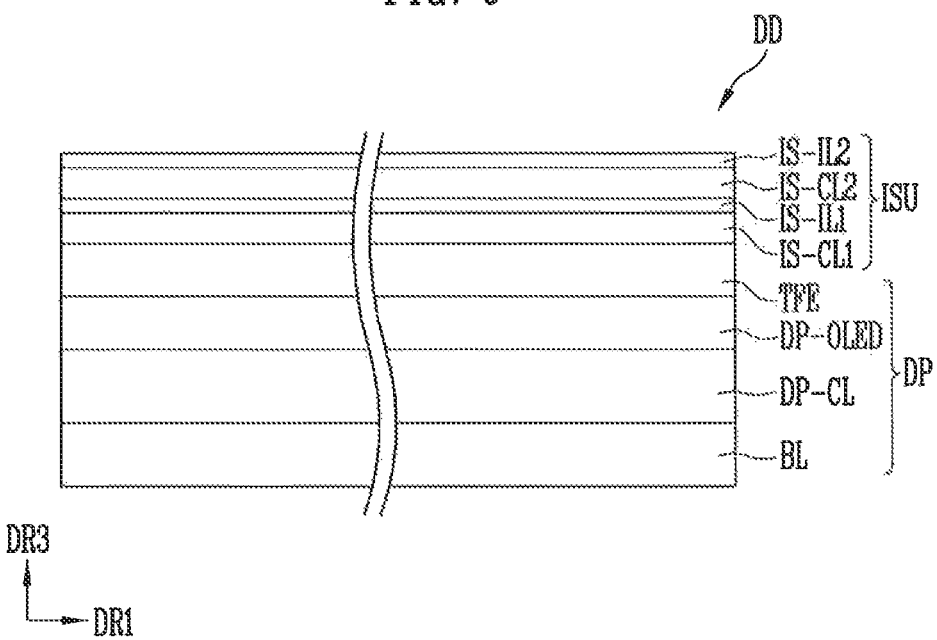
FIG. 6 is a view illustrating a display device according to an embodiment of the inventive concept.

FIG. 6 is a sectional view of a display device DD according to an embodiment of the inventive concept.

In FIG. 6, a display panel DP is illustrated to show a stacking relationship of an input sensing unit ISU. A reflection preventing unit and a window unit, which may be disposed on the input sensing unit ISU, are not shown.

In this embodiment of the inventive concept, the input sensing unit ISU is in the "layer" form, which is described with reference to FIGS. 2A and 2C, and will be exemplarily described. As the input sensing unit ISU in the "layer" form is directly disposed on the base surface provided by the display panel DP, the base layer is omitted, unlike the input sensing unit ISU in the "panel" form. Thus, the thickness of the display module DM can be decreased in the layer form. In this embodiment, the base surface may be a top surface of a thin-film encapsulation layer TFE.

Either of the input sensing unit ISU in the "layer" form and the input sensing unit ISU in the "panel" form may have a multi-layered structure. The input sensing unit ISU may include, for example, a sensing electrode, a signal line connected to the sensing electrode, and at least one insulating layer. The input sensing unit ISU may sense an external input, using, for example, a capacitance method. In the embodiments of the inventive concept, the operating method of the input sensing unit ISU is not particularly limited. In an embodiment of the inventive concept, the input sensing unit ISU may sense an external input, using an electromagnetic induction method or a pressure sensing method.

As shown in FIG. 6, the input sensing unit ISU according to the embodiment of the inventive concept, may include a first conductive layer IS-CL1, a first insulating layer IS-IL1, a second conductive layer IS-CL2, and a second insulating layer IS-IL2.

Each of the first conductive layer IS-CL1 and the second conductive layer IS-CL2 may be formed to have a single-layered structure, or may have a multi-layered structure in which layers are stacked along a third direction DR3.

The conductive layer having the single-layered structure may include, for example, a metal layer or a transparent conductive layer.

The metal layer may include, for example, molybdenum, silver, titanium, copper, aluminum, and any alloy thereof.

The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include conductive polymer such as PEDOT, metal nanowire, graphene, etc.

The conductive layer having the multi-layered structure may include multi-layered metal layers. The multi-layered metal layers may have a triple structure of, for example, titanium/aluminum/titanium. The conductive layer having the multi-layered structure may include at least one or more of the metal layers described herein and at least one transparent conductive layer.

Each of the first conductive layer IS-CL1 and the second conductive layer IS-CL2 may include a plurality of conductive patterns. Hereinafter, it is described that the first conductive layer IS-CL1 includes first conductive patterns and the second conductive layer IS-CL2 includes second conductive patterns and third conductive patterns. Each of the first conductive patterns, the second conductive patterns, and the third conductive patterns may include sensing electrodes and signal lines.

The stack structure and the material of the sensing electrodes may be determined by considering a sensing sensitivity. For example, an RC delay may have influence on the sensing sensitivity. Since the sensing electrodes including the metal layer have a resistance lower than that of the transparent conductive layer, the RC value of the sensing electrodes is decreased. Therefore, the charging time of a capacitor defined between the sensing electrodes is decreased. The sensing electrodes including the transparent conductive layer are not viewed by a user, as compared with the metal layer, and the input area of the sensing electrodes is increased, thereby increasing capacitance.

The sensing electrodes including the metal layer may have, for example, a mesh shape so as to prevent the sensing electrodes from being viewed by the user.

Meanwhile, the thickness of the thin-film encapsulation layer TFE may be adjusted such that noise generated by components of a display element layer DP-OLED does not influence operation of the input sensing unit ISU. Each of the first insulating layer IS-IL1 and the second insulating layer IS-IL2 may have a single-layer or multi-layered structure. Each of the first insulating layer IS-IL1 and the second insulating layer IS-IL2 may include an inorganic material, an organic material, or a composite material.

At least one of the first insulating layer IS-IL1 and the second insulating layer IS-IL2 may include an inorganic layer. The inorganic layer may include at least one of, for example, aluminum oxide, titanium oxide, silicon oxide, silicon oxynitride, zirconium oxide, and hafnium oxide.

At least one of the first insulating layer IS-IL1 and the second insulating layer IS-IL2 may include an organic layer. The organic layer may include at least one of acryl-based resin, methacryl-based resin, polyisoprene, vinyl-based resin, epoxy-based resin, urethane-based resin, cellulose-based resin, siloxane-based resin, polyimide-based resin, polyimide-based resin, and perylene-based resin.

In some embodiments of the inventive concept, the first conductive patterns, the second conductive patterns, and the third conductive patterns may be formed of Ag-nanowire. The first conductive patterns, the second conductive patterns, and the third conductive patterns may have elasticity.

The first insulating layer IS-IL1 and the second insulating layer IS-IL2 may include polydimethylsiloxane (PDMS). The first insulating layer IS-IL1 and the second insulating layer IS-IL2 may have elasticity.

The input sensing unit ISU may sense a pressure, using the above-described elasticity.

For example, as a pressure is applied to the input sensing unit ISU, the distances between the first conductive patterns, the second conductive patterns, and the third conductive patterns may be changed.

If the distances between the first conductive patterns, the second conductive patterns, and the third conductive patterns are changed from pressure being applied, the capacitances between the first conductive patterns, the second conductive patterns, and the third conductive patterns may be changed.

Thus, the input sensing unit ISU can sense a pressure, for example, an externally applied pressure from a user, based on a change in capacitance, and the amount of the change in capacitance can correlate to the amount of pressure being applied, for example, versus a state when less pressure or no pressure is applied.

In some embodiments of the inventive concept, any one of the first insulating layer IS-IL1 and the second insulating layer IS-IL2 may be a polymer layer, e.g., an acrylic polymer layer.

The polymer layer can enhance flexibility of the display device DD even when the input sensing unit ISU is directly disposed on the display panel DP as shown in FIGS. 2A and 2C.

FIG. 7A is a plan view of a first conductive layer IS-CL1 of the input sensing unit ISU according to an embodiment of the inventive concept.

Referring to FIG. 7A, the first conductive layer IS-CL1 may include a plurality of first sensing electrodes IE1-1 to IE1-5. It should be understood and appreciated by a person of ordinary skill in the art that the quantity of first sensing electrodes may be more or less than shown in this embodiment.

The first conductive pattern described in FIG. 6 may correspond to the plurality of first sensing electrodes IE1-1 to IE1-5.

The plurality of first sensing electrodes IE1-1 to IE1-5 may arranged in a first direction DR1, and each of the first sensing electrodes IE1-1 to IE1-5 may extend in a second direction DR2.

The plurality of first sensing electrodes IE1-1 to IE1-5 may sense an external input, using a mutual cap method and/or a self-cap method. After a coordinate of the external input is calculated using the mutual cap method during a first section, a coordinate of the external input may be re-calculated using the self-cap method during a second section.

Although the plurality of the first sensing electrodes IE1-1 to IE1-5 are illustrated in FIG. 7A according to an embodiment, the shape of the first sensing electrodes IE1-1 to IE1-5 is not limited to the shape shown, and the first sensing electrodes IE1-1 to IE1-5 may have various shapes, for example, a rhombus shape. Other shapes may be provided, and the plurality of first electrodes may have respectively different shapes amongst each other.

Sensing pads IS-PD and signal pads DP-PD, which are included in the input sensing unit ISU, may be disposed to overlap with the first conductive layer IS-CL1.

The sensing pads IS-PD and the signal pads DP-PD may be aligned in a pad area NDA-PD, that in this example is a non-display area. However, the embodiments of the inventive concept are not limited to the arrangement of the sensing pads IS-PD and the signal pads DP-PD as shown.

Signal lines may be connected to first ends of the first sensing electrodes IE1-1 to IE1-5, respectively. In some embodiments, the signal lines may be connected to first ends and second ends of the first sensing electrodes IE1-1 to IE1-5.

The first sensing electrodes IE1-1 to IE1-5 may be connected to corresponding sensing pads IS-PD through the signal lines, respectively.

Meanwhile, in an embodiment of the inventive concept, the signal lines may be separately manufactured to be arranged on a circuit board or the like, which is coupled thereto.

In an embodiment of the inventive concept, the positions of the signal lines may be variously arranged.

Although not shown in FIG. 7A, the first insulating layer IS-IL1 may cover the first sensing electrodes IE1-1 to IE1-5.

In this embodiment of the inventive concept, the first insulating layer IS-IL1 may cover the signal lines. In some embodiments, the first insulating layer IS-IL1 may overlap with the display area DD-DA and the pad area NDA-PD. The insulating layer IS-IL1 may partially cover the signal lines.

Although not shown in FIG. 7A, the first insulating layer IS-IL1 may overlap with the display area DD-DA and at least a portion of the non-display area DD-NDA. In some embodiments of the inventive concept, the first insulating layer IS-IL1 may expose the pad area NDA-PD.

In some embodiments of the inventive concept, the first sensing electrodes IE1-1 to IE1-5 may have a mesh shape and include a metal to enhance flexibility. The first sensing electrodes IE1-1 to IE1-5 may be designated as metal mesh patterns.

Figure 7B:
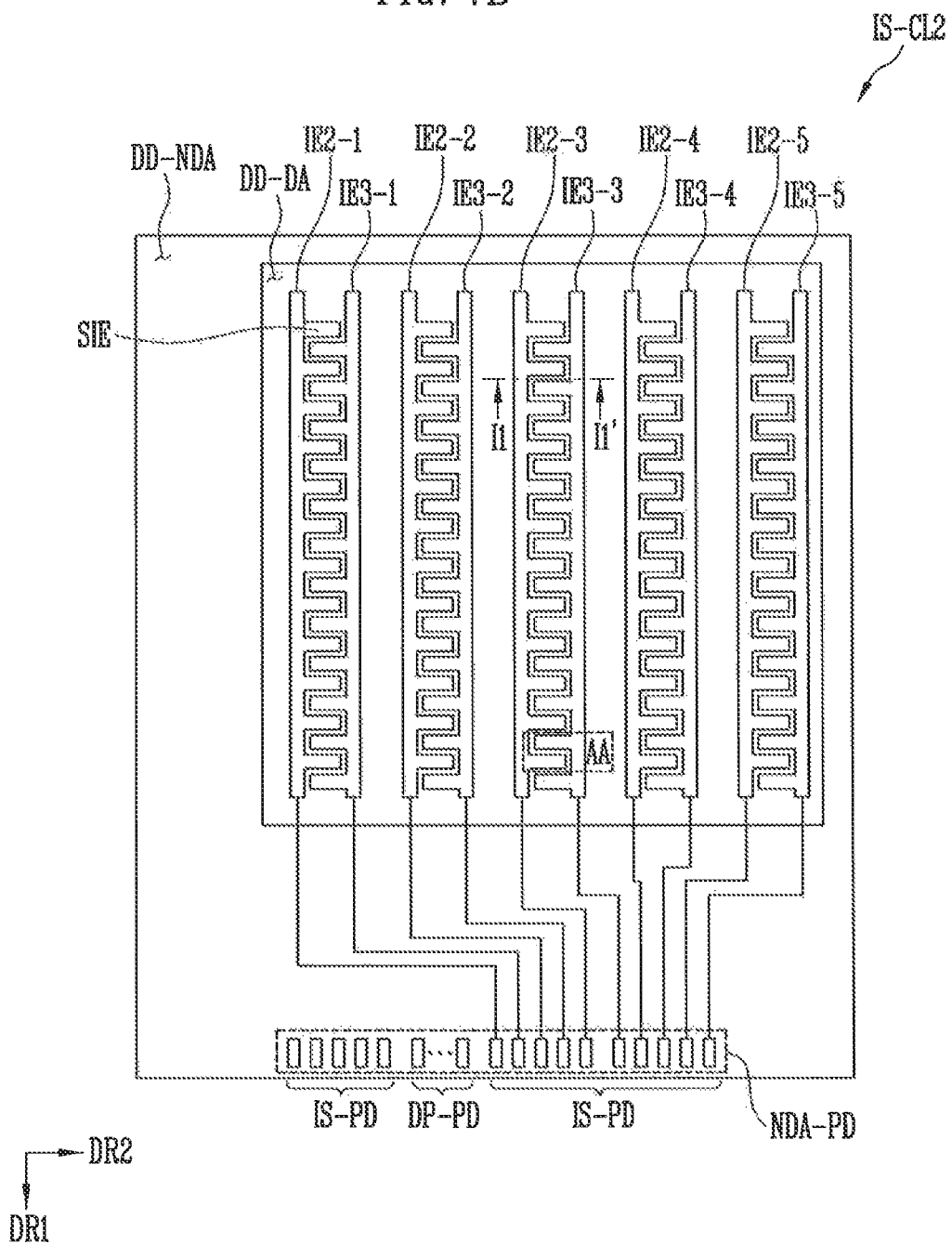

FIG. 7B is a plan view of a second conductive layer IS-CL2 of the input sensing unit ISU according to an embodiment of the inventive concept.

The second conductive layer IS-CL2 may be directly disposed on the first insulating layer IS-IL1 (see FIG. 6).

The second conductive layer IS-CL2 may include a plurality of second sensing electrodes IE2-1 to IE2-5, and a plurality of and third sensing electrodes IE3-1 to IE3-5.

The second conductive pattern described in FIG. 6 may correspond to the plurality of second sensing electrodes IE2-1 to IE2-5. In addition, the third conductive pattern described in FIG. 6 may correspond to the plurality of third sensing electrodes IE3-1 to IE3-5.

The plurality of second sensing electrodes IE2-1 to IE2-5 may be arranged in a second direction DR2, and each of the second sensing electrodes IE2-1 to IE2-5 may extend in a first direction DR1. The plurality of third sensing electrodes IE3-1 to IE3-5 may also be arranged in the second direction DR2, and each of the third sensing electrodes IE3-1 to IE3-5 may extend in the first direction DR1.

The plurality of second sensing electrodes IE2-1 to IE2-5 and the third sensing electrodes IE3-1 to IE3-5 may sense an external input, using a mutual cap method and/or a self-cap method. After a coordinate of the external input is calculated using the mutual cap method during a first section, a coordinate of the external input may be re-calculated using the self-cap method during a second section.

Although the plurality of second sensing electrodes IE2-1 to IE2-5 and the third sensing electrodes IE3-1 to IE3-5 according to an embodiment are illustrated in FIG. 7B, the shapes of the second sensing electrodes IE2-1 to IE2-5 and the third sensing electrodes IE3-1 to IE3-5 are not particularly limited, and the second sensing electrodes IE2-1 to IE2-5 and the third sensing electrodes IE3-1 to IE3-5 may have various shapes.

For example, the second sensing electrodes IE2-1 to IE2-5 and the third sensing electrodes IE3-1 to IE3-5 may be formed in various patterns. It is also within some embodiments of the inventive concept, that quantities of the plurality of first sensing electrodes IE1-1 to IE1-5, the plurality of second sensing electrode IE2-1 to IE2-5, and the plurality of the third sensing electrodes IE3-1 to IE3-5 may be different from each other. However, in the case of the comb-tooth structure, such as shown in FIG. 7B, the plurality of second sensing electrode IE2-1 to IE2-5, and the plurality of the third sensing electrodes IE3-1 to IE3-5 are the same.

Although an embodiment of the inventive concept in which the second sensing electrodes IE2-1 to IE2-5 and the third sensing electrodes IE3-1 to IE3-5 are formed in a comb-teeth pattern or a castle pattern is illustrated in FIG. 7B, a artisan should understand and appreciate that other embodiments of the inventive concept are not limited thereto.

According to the comb-teeth pattern shown in FIG. 7B, each of the second sensing electrodes IE2-1 to IE2-5 and the third sensing electrodes IE3-1 to IE3-5 may include sub-sensing electrodes SIE.

The sub-sensing electrodes SIE may be arranged in the first direction DR1 and extend in the second direction DR2. However, embodiments of the inventive concept are not limited thereto.

For example, the width of the sub-sensing electrodes SIE may be set to be substantially equal to that of the second sensing electrodes IE2-1 to IE2-5 and the third sensing electrodes IE3-1 to IE3-5. The term "substantially equal" in an embodiment is a width of the sub-sensing electrodes SIE being within 1% of the width of the second sensing electrodes IE2-1 to IE2-5 and the third sensing electrodes IE3-1 to IE3-5. In another embodiment, a substantially equal width of the sub-sensing electrodes SIE is within 3% of the width of the second sensing electrodes IE2-1 to IE2-5 and the third sensing electrodes IE3-1 to IE3-5. In still another embodiment, a substantially equal of the sub-sensing electrodes SIE is within 5% of the width of the second sensing electrodes IE2-1 to IE2-5 and the third sensing electrodes IE3-1 to IE3-5.

Although the sub-sensing electrodes SIE according to an embodiment of the inventive concept are illustrated in FIG. 7B, the shape of the sub-sensing electrodes SIE is not particularly limited to the shape shown and described, and the sub-sensing electrodes SIE may have various shapes.

Sensing pads IS-PD and signal pads DP-PD, which are included in the input sensing unit ISU, may be disposed to overlap with the second conductive layer IS-CL2.

The sensing pads IS-PD and the signal pads DP-PD may be aligned in a pad area NDA-PD.

Signal lines may be connected to first ends of the second sensing electrodes IE2-1 to IE2-5 and to the third sensing electrodes IE3-1 to IE3-5, respectively.

In some embodiments of the inventive concept, the signal lines may be connected to both ends of the second sensing electrodes IE2-1 to IE2-5 and the third sensing electrodes IE3-1 to IE3-5.

The second sensing electrodes IE2-1 to IE2-5 and the third sensing electrodes IE3-1 to IE3-5 may be connected to corresponding sensing pads IS-PD through the signal lines, respectively.

Meanwhile, in an embodiment of the inventive concept, the signal lines may be separately manufactured for arrangement with a circuit board or the like, which is coupled thereto.

In an embodiment of the inventive concept, the positions of the signal lines may be variously arranged.

The plurality of first sensing electrodes IE1-1 to IE1-5, the plurality of second sensing electrodes IE2-1 to IE2-5, and the plurality of third sensing electrodes IE3-1 to IE3-5 may intersect each other.

Although not shown in FIG. 7B, the second insulating layer IS-IL2 may cover the plurality of second sensing electrodes IE2-1 to IE2-5 and the plurality of third sensing electrodes IE3-1 to IE3-5.

In this embodiment of the inventive concept, the second insulating layer IS-IL2 may overlap with the display area DD-DA and the pad area NDA-PD.

The second insulating layer IS-IL2 may cover the signal lines. In some embodiments of the inventive concept, the second insulating layer IS-IL2 may overlap with the display area DD-DA and the pad area NDA-PD.

Although not shown in FIG. 7B, the second insulating layer IS-IL2 may overlap with the display area DD-DA and at least a portion of the non-display area DD-NDA. In some embodiments of the inventive concept, the second insulating layer IS-IL2 may expose the pad area NDA-PD.

In some embodiments of the inventive concept, the second sensing electrodes IE2-1 to IE2-5 and the third sensing electrodes IE3-1 to IE3-5 may have a mesh shape and include a metal to enhance flexibility. The second sensing electrodes IE2-1 to IE2-5 and the third sensing electrodes IE3-1 to IE3-5 may be designated as metal mesh patterns.

Figure 8:
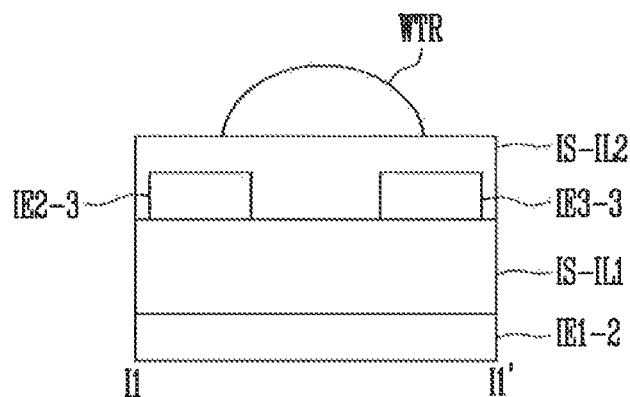
FIG. 8 is a view illustrating a section of the input sensing unit according to an embodiment of the inventive concept.
Figure 8:

FIG. 8 is a view illustrating a section of the input sensing unit ISU according to the embodiment of the inventive concept. FIG. 8 illustrates a section of the input sensing unit ISU, which is taken along line shown in FIGS. 7A and 7B.

Referring to FIGS. 6, 7A, 7B and 8, the input sensing unit ISU may include a first sensing electrode IE1-2, a first insulating layer IS-IL1, a second sensing electrode IE2-3 a third sensing electrode IE3-3, and a second insulating layer IS-IL2. For convenience of description, a case where moisture (WTR), such as a drop of water, etc., is in contact with the second insulating layer IS-IL2 on the second insulating layer IS-IL2. However, as described in FIGS. 2A, 2B and 2C, the moisture WTR may be in contact with the window layer WL or the window panel WP on the window layer WL or the window panel WP.

The input sensing unit ISU may sense a touch of a user.

For example, if the user touches the an upper part of the input sensing unit ISU with a finger thereof, the finger of the user may be in contact with the upper part of the second sensing electrode IE2-3 and the third sensing electrode IE3-3.

If the finger of the user is in contact with the upper portion of the second sensing electrode IE2-3 and the third sensing electrode IE3-3, a portion of the electric field formed by the second sensing electrode IE2-3 and the first sensing electrode IE1-2 may be decreased, and a portion of the electric field formed between the third sensing electrode IE3-3 and the first electrode IE1-2 may be decreased.

If the electric field is decreased, the capacitance formed between the second sensing electrode IE2-3 and the first sensing electrode IE1-2 may be changed, and the capacitance formed between the third sensing electrode IE3-3 and the first electrode IE1-2 may be changed. At this time, the capacitance formed between the second sensing electrode IE2-3 and the first sensing electrode IE1-2 may be decreased, and the capacitance formed between the third sensing electrode IE3-3 and the first electrode IE1-2 may be decreased.

Thus, the input sensing unit ISU can sense a touch, based on a change in capacitance.

The input sensing unit ISU may also (or alternatively) sense a pressure.

For example, if a pressure is applied to the input sensing unit ISU, the distance between the second sensing electrode IE2-3 and the first sensing electrode IE1-2 may be changed, and the distance between the third sensing electrode IE3-3 and the first electrode IE1-2 may be changed.

As described above, if the distance between the sensing electrodes is changed, the capacitance formed between the second sensing electrode IE2-3 and the first sensing electrode IE1-2 may be changed, and the capacitance formed between the third sensing electrode IE3-3 and the first electrode IE1-2 may be changed The capacitance formed between the second sensing electrode IE2-3 and the first sensing electrode IE1-2 may be increased, and the capacitance formed between the third sensing electrode IE3-3 and the first electrode IE1-2 may be increased.

Thus, the input sensing unit ISU can sense a pressure, based on a change in capacitance, and the amount of change in capacitance may correspond to the amount of pressure being applied.

The input sensing unit ISU may sense a degree of moisture.

For example, if the user touches the upper surface of the input sensing unit ISU with a finger thereof, the finger of the user may be in contact with the top of the second sensing electrode IE2-3 and the third sensing electrode IE3-3.

The finger of the user may include a certain amount of moisture. As an example, the moisture included in the finger of the user is expressed as moisture WTR in FIG. 8.

The moisture WTR may have a dielectric constant relatively higher than that of air. For example, when assuming that the dielectric constant of the air is 1, the dielectric constant of the moisture WTR may be 80 or more.

As the moisture WTR is located between the second sensing electrode IE2-3 and the third sensing electrode IE3-3, the capacitance formed between the second sensing electrode IE2-3 and the third sensing electrode IE3-3 may be changed.

The capacitance formed between the second sensing electrode IE2-3 and the third sensing electrode IE3-3 may be increased.

Thus, the input sensing unit ISU can sense a degree of moisture, based on a change in capacitance.

Figure 9:
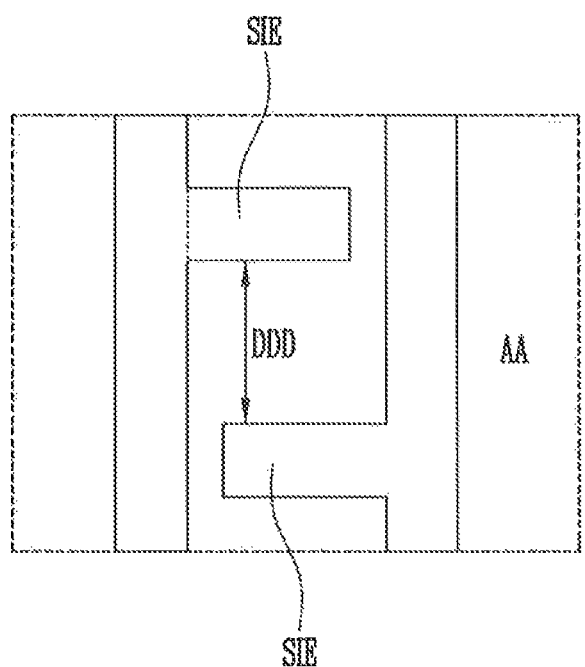
FIG. 9 is a view illustrating in detail the input sensing unit according to an embodiment of the inventive concept.

FIG. 9 is a view illustrating in detail the input sensing unit according to the embodiment of the inventive concept. FIG. 9 is an enlarged view of surface AA of the second conductive layer IS-CL2 shown in FIG. 7B.

Referring to FIG. 9, the second sensing electrode IE2-3 and the third sensing electrode IE3-2 may include sub-sensing electrodes SIE.

In some embodiments of the inventive concept, the sub-sensing electrodes SIE may be designed to be engaged with each other, like saw-toothed wheels.

The distance DDD between the sub-sensing electrodes SIE may be set to a preset value.

For example, the distance DDD may be set to be, for example, about 100 μm or more. In some embodiments, the distance DDD may be set to be within a range from about 300 μm or more to about 500 μm or less. In these examples, the term "about" 300 μm . . . , 500 μm" should be understood by an artisan to mean by about 5%.

The input sensing circuit IS-C shown in FIG. 4 may drive the input sensing unit ISU. For example, the input sensing unit ISU may be driven at 200 KHz under the control of the input sensing circuit IS-C. In an embodiment of the inventive concept, the input sensing unit ISU may be driven at about 175 KHz to 225 KHz under control of the input sensing circuit.

According to the embodiments of the inventive concept, the input sensing unit and the display device including the same can sense one or more of a touch, a pressure, and a degree of moisture.

Example embodiments of the inventive concept have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the embodiments of the inventive concept as set forth in the following claims.

What is claimed is:
1. An input sensing unit comprising:
a first conductive layer including a plurality of first sensing electrodes;
a second conductive layer disposed on the first conductive layer, the second conductive layer including a plurality of second sensing electrodes and a plurality of third sensing electrodes; and
at least one insulating layer insulating the first conductive layer and the second conductive layer from each other,
wherein the input sensing unit senses a degree of pressure applied based on a change in distance between electrodes from the plurality of first sensing electrodes and electrodes from at least one of the plurality of second sensing electrodes or the plurality of third sensing electrodes,
wherein the input sensing unit senses a touch and a degree of moisture applied based on a change in capacitance between electrodes from at least the plurality of second sensing electrodes and the plurality of third sensing electrodes,
wherein the plurality of first sensing electrodes are arranged in a first direction and extend parallel to a second direction,
wherein the plurality of second sensing electrodes are alternately arranged with the plurality of third sensing electrodes in the second direction and extend parallel to the first direction,
wherein each of the plurality of second sensing electrodes includes a respective plurality of second sub-sensing electrodes that are arranged in the first direction and extend in a comb-tooth pattern parallel to the second direction with at least some of each respective plurality of second sub-sensing electrodes fully overlapped by the plurality of first sensing electrodes,
wherein each of the plurality of third sensing electrodes includes a respective plurality of third sub-sensing electrodes that are arranged in the first direction and extend in a comb-tooth pattern parallel to the second direction,
wherein each of the plurality of second sensing electrodes including the respective plurality of second sub-sensing electrodes and each of the plurality of third sensing electrodes including the respective plurality of third sub-sensing electrodes are arranged as opposite sides of a zippered comb-tooth structure.

2. The input sensing unit of claim 1,
wherein the plurality of third sensing electrodes are arranged in the second direction and extend parallel to the first direction,
wherein each of the plurality of third sensing electrodes includes a plurality of third sub-sensing electrodes that are arranged in the first direction and extend parallel to the second direction parallel to the plurality of first sensing electrodes.

3. The input sensing unit of claim 2,
wherein the at least one insulating layer comprises an elastic material,
wherein the second conductive layer comprises a flexible material, and
wherein at least one of the plurality of second sensing electrodes, or the plurality of third sensing electrodes are formed of a conductive mesh to enhance flexibility.

4. The input sensing unit of claim 2, wherein the plurality of second sub-sensing electrodes are directly interleaved with the plurality of third sub-sensing electrodes to form a substantially equidistant interleaved comb-tooth pattern on the second conductive layer.

5. The input sensing unit of claim 2, wherein the plurality of first sensing electrodes, the plurality of second sensing electrodes, and the plurality of third sensing electrodes are formed of Ag-nanowire.

6. The input sensing unit of claim 5, wherein the at least one insulating layer includes viscoelastic polydimethylsiloxane.

7. The input sensing unit of claim 6, wherein a pressure is sensed based on a change in capacitance between at least one of the plurality of first sensing electrodes and at least one of the plurality of second sensing electrodes and a change in capacitance between at least one of the plurality of first sensing electrodes and at least one of the plurality of third sensing electrodes.

8. The input sensing unit of claim 7, wherein a degree of moisture is sensed based on a change in capacitance between at least one of the plurality of second sensing electrodes and at least one of the plurality of third sensing electrodes.

9. An input sensing unit comprising:
a first conductive layer including a plurality of first sensing electrodes; and
a second conductive layer disposed on the first conductive layer, the second conductive layer including a plurality of second sensing electrodes and a plurality of third sensing electrodes,
wherein the input sensing unit senses a touch, a pressure, and a degree of moisture applied based on a change in capacitance between electrodes from at least two of the plurality of first sensing electrodes, the plurality of second sensing electrodes or the plurality of third sensing electrodes,
wherein the plurality of first sensing electrodes are arranged in a first direction and extend parallel to a second direction different from the first direction,
wherein the plurality of second sensing electrodes are arranged in the second direction and extend parallel to the first direction,
wherein the plurality of third sensing electrodes are arranged in the second direction and extend parallel to the first direction,
wherein the plurality of second sensing electrodes and the plurality of third sensing electrodes each includes sub-sensing electrodes arranged in the first direction, the sub-sensing electrodes extending in respective comb-tooth patterns parallel to the second direction with a plurality of the sub-sensing electrodes fully overlapped by the plurality of first sensing electrodes,
wherein the plurality of second sub-sensing electrodes and the plurality of third sub-sensing electrodes are arranged as opposite sides of a zippered comb-tooth structure.

10. The input sensing unit of claim 9, wherein a width of the second sub-sensing electrodes and the third sub-sensing electrodes is set to be substantially equal to that of the plurality of the second sensing electrodes and the plurality of the third sensing electrodes.

11. The input sensing unit of claim 9, wherein a distance between the second sub-sensing electrodes and the third sub-sensing electrodes is set within a range of about 300 μm to about 500 μm.

12. A display device comprising:
a display panel including a display area and a non-display area; and
an input sensing unit disposed on the display panel, wherein the input sensing unit includes:
a first conductive layer including a plurality of first sensing electrodes arranged in a first direction and extending parallel to a second direction different from the first direction;
a flexible second conductive layer disposed on the first conductive layer, the second conductive layer including a plurality of second sensing electrodes and a plurality of third sensing electrodes; and
at least one elastic insulating layer insulating the first conductive layer and the second conductive layer from each other,
wherein the input sensing unit senses a touch, a pressure, and a degree of moisture based on a change in distance or capacitance between electrodes from at least the plurality of the firstسensing electrodes, the plurality of the second sensing electrodes and the plurality of the third sensing electrodes,
wherein the plurality of second sensing electrodes and the plurality of third sensing electrodes are arranged in the second direction and extend parallel to the first direction,
wherein the plurality of second sensing electrodes and the plurality of the third sensing electrodes each include second sub-sensing electrodes and third sub-sensing electrodes, respectively, arranged in the first direction, the second sub-sensing electrodes and third sub-sensing electrodes extending in respective comb-tooth patterns parallel to the second direction with at least one of the plurality of second sub-sensing electrodes or the plurality of third sub-sensing electrodes fully overlapped by the plurality of first sensing electrodes,
wherein each of the plurality of second sub-sensing electrodes and each of the plurality of third sub-sensing electrodes are respectively arranged to form opposite sides of a zippered comb tooth structure.

13. The display device of claim 12, wherein the input sensing unit comprises an input sensing layer directly disposed on the display panel that acquires at least one of coordinate information or pressure information of an external input.

14. The display device of claim 12,
wherein the second sub-sensing electrodes extend normal from a corresponding one of the plurality of second sensing electrodes and parallel to the plurality of first sensing electrodes, and the third sub-sensing electrodes extend normal from a corresponding one of the plurality of third sensing electrodes and parallel to the plurality of first sensing electrodes, and wherein the plurality of second sensing electrodes and the plurality of third sensing electrodes are each formed of conductive mesh to enhance flexibility.

15. The display device of claim 12, wherein the second sub-sensing electrodes and the third sub-sensing electrodes are directly interleaved on the second conductive layer.

16. The display device of claim 12, wherein the input sensing unit is directly disposed on the display panel.

17. The display device of claim 12, wherein the input sensing unit includes a base layer disposed under the first conductive layer.

18. The display device of claim 15, wherein the substantially equal distance between the second sub-sensing electrodes and the third sub-sensing electrodes is set to a preset value of at least 100 µm.

19. The display device of claim 12, further comprising:
a timing control circuit configured to control operation of the display panel; and
an input sensing circuit configured to control the input sensing unit.

20. The display device of claim 19, wherein the input sensing unit is driven at about 175 KHz to about 225 KHz under control of the input sensing circuit.

* * * * *